(12) United States Patent
Park et al.

(10) Patent No.: US 8,558,400 B2
(45) Date of Patent: Oct. 15, 2013

(54) SEMICONDUCTOR PACKAGES AND METHODS OF FABRICATING THE SAME

(75) Inventors: Jin-Woo Park, Seoul (KR); Eunchul Ahn, Yongin-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/204,188

(22) Filed: Aug. 5, 2011

(65) Prior Publication Data

US 2012/0091579 A1   Apr. 19, 2012

(30) Foreign Application Priority Data

Oct. 19, 2010  (KR) .......................... 10-2010-0102011

(51) Int. Cl.
*H01L 23/28* (2006.01)
(52) U.S. Cl.
USPC ........... 257/788; 257/782; 257/787; 257/737; 257/778; 257/783; 257/E23.068; 257/E23.023; 438/127; 438/118
(58) Field of Classification Search
USPC .......... 257/737, 782, E23.068, E23.023, 788, 257/778, 787, 783; 438/127, 118
See application file for complete search history.

(56) References Cited

U.S. PATENT DOCUMENTS

| | | | |
|---|---|---|---|
| 6,040,631 A * | 3/2000 | Dibble et al. ................. | 257/783 |
| 6,448,665 B1 * | 9/2002 | Nakazawa et al. ............ | 257/789 |
| 6,821,878 B2 * | 11/2004 | Danvir et al. ................. | 438/613 |
| 7,141,448 B2 | 11/2006 | Ramalingam et al. | |
| 2002/0017728 A1 | 2/2002 | Ramalingam et al. | |
| 2003/0218261 A1 * | 11/2003 | Capote et al. ................. | 257/787 |
| 2004/0184226 A1 * | 9/2004 | Hall ............................. | 361/683 |
| 2005/0224969 A1 * | 10/2005 | Wu .............................. | 257/737 |
| 2008/0268579 A1 | 10/2008 | Yu et al. | |
| 2012/0068353 A1 * | 3/2012 | Huang et al. ................. | 257/774 |

FOREIGN PATENT DOCUMENTS

| | | |
|---|---|---|
| KR | 20010054743 A | 7/2001 |
| KR | 100498675 | 3/2005 |
| KR | 100871710 | 10/2008 |

\* cited by examiner

*Primary Examiner* — Asok K Sarkar
*Assistant Examiner* — Dmitriy Yemelyanov
(74) *Attorney, Agent, or Firm* — Harness, Dickey & Pierce P.L.C.

(57) ABSTRACT

A semiconductor package includes a wiring board including an upper connection pad provided on a first surface and a lower connection pad provided on a second surface opposite to the first surface, a semiconductor chip having a bonding pad area in which a bonding pad is provided and an adhesive area except the bonding pad area, and being mounted on the first surface of the wiring board in a flip-chip manner such that the bonding pad is electrically connected to the upper connection pad, a first molding layer provided between the adhesive area of the semiconductor chip and the first surface of the wiring board, and a second molding layer provided between the bonding pad area of the semiconductor chip and the first area of the wiring board while covering the first surface of the wiring board and the semiconductor chip. The first molding layer has a lower modulus than the second molding layer.

15 Claims, 10 Drawing Sheets

1000

SEMICONDUCTOR PACKAGES AND METHODS OF FABRICATING THE SAME

CROSS-REFERENCE TO RELATED APPLICATIONS

This application claims priority under 35 U.S.C. §119 to Korean Patent Application No. 10-2010-0102011, filed on Oct. 19, 2010, in the Korean Intellectual Property Office (KIPO), the entire contents of which is incorporated herein by reference.

BACKGROUND

1. Field

Example embodiments of the inventive concepts generally relate to semiconductor packages and methods of fabricating the same and, more particularly, to board on chip (BOC) type semiconductor packages and methods of fabricating the same.

2. Description of Related Art

A major trend in electronic industry today is to manufacture lighter, smaller, faster, multi-functional, high-performance, and high-reliability products at low costs. An important technology making this trend possible is packaging technology. A recently developed package type is a chip scale package (CSP), which provides a semiconductor package miniaturized to have almost the same dimension as a semiconductor chip.

Not only miniaturized packages but also large-capacity packages may be required. In order to increase capacity of semiconductor chips, a technology which enables a greater number of cells to be formed in a limited space of a semiconductor chip may improve integration density. Accordingly, various studies have been focused on methods capable of achieving high integration using recently developed semiconductor chips or semiconductor packages. For example, much attention has been focused on a multi-chip stacked package in which semiconductor chips are three-dimensionally stacked or a stack-type semiconductor package in which semiconductor packages are three-dimensionally stacked.

A multi-chip stacked package or a system-in-package may perform the functions of multiple unit semiconductor devices in one semiconductor package. A multi-chip stacked package or a system-in-package is somewhat greater in thickness than a conventional single-chip package, but is nearly equal in plane area to the conventional single-chip package. For this reason, multi-chip stacked packages or system-in-packages are mainly used in high-functioning and small-sized portable products such as cellular phones, laptop computers, memory cards, and portable camcorders.

SUMMARY

Example embodiments of the inventive concepts may provide semiconductor packages and methods of fabricating the same.

According to some example embodiments of the inventive concepts, a semiconductor package may include a wiring board including an upper connection pad provided on a first surface and a lower connection pad provided on a second surface opposite to the first surface, a semiconductor chip having a bonding pad area in which a bonding pad is provided and an adhesive area except the bonding pad area, and being mounted on the first surface of the wiring board in a flip-chip manner such that the bonding pad is electrically connected to the upper connection pad, a first molding layer provided between the adhesive area of the semiconductor chip and the first surface of the wiring board, and a second molding layer provided between the bonding pad area of the semiconductor chip and the first area of the wiring board while covering the first surface of the wiring board and the semiconductor chip. The first molding layer may have a lower modulus than the second molding layer.

According to at least one example embodiment, the wiring board may further include a vent hole provided at a portion corresponding to the bonding pad area of the semiconductor chip and penetrating the wiring board. According to at least one example embodiment, the second molding layer may further cover a portion of the second surface of the wiring board with width greater than a diameter of the vent hole while covering the vent hole. According to at least one example embodiment, the bonding pad of the semiconductor chip may have one selected from the group consisting of a center-type bonding pad arrangement, an edge-type bonding pad arrangement, a cross-type bonding pad arrangement, and a combination thereof.

According to at least one example embodiment, the semiconductor package may further include a solder ball provided on the lower connection pad of the wiring board. According to at least one example embodiment, the second molding layer may contain an epoxy molding compound. According to at least one example embodiment, the semiconductor package may further include a bump provided on the bonding pad of the semiconductor chip. According to at least one example embodiment, the semiconductor package may further include a connection terminal electrically connecting the upper connection pad of the wiring board to the bump.

According to other example embodiments of the inventive concepts, a method of fabricating a semiconductor package may include preparing a semiconductor chip having a bonding pad area in which a bonding pad is provided and an adhesive area except the bonding pad area, preparing a wiring board including an upper connection pad corresponding to the bonding pad of the semiconductor chip provided on a first surface and a lower connection pad provided on a second surface opposite to the first surface, forming a first molding layer on the first surface of the wiring board corresponding to the adhesive area of the semiconductor chip to be mounted, mounting the semiconductor chip on the first surface of the wiring board such that the bonding pad of the semiconductor chip is electrically connected to the upper connection pad of the wiring board, and forming a second molding layer to fill a space between the bonding pad area of the semiconductor chip and the first surface of the wiring board while covering the first surface of the wiring board and the semiconductor chip. The first molding layer may have a lower modulus than the second molding layer.

According to at least one example embodiment, the wiring board may further include a vent hole provided at a portion corresponding to the bonding pad area of the semiconductor chip and penetrating the wiring board. The second molding layer may further cover a portion of the second surface of the wiring board through the vent hole with width greater than a diameter of the vent hole while covering the vent hole. According to at least one example embodiment, the forming of the first molding layer may be carried out using a screen-printing manner. According to at least one example embodiment, the forming of the second molding layer may include installing the wiring board with the semiconductor chip mounted thereon to a molding apparatus and injecting a molding material into the molding apparatus. The molding material may contain an epoxy molding compound.

According to at least one example embodiment, the method may further include forming a solder ball on the lower connection pad of the wiring board. According to at least one example embodiment, the boding pad of the semiconductor chip may have one selected from the group consisting of a center-type bonding pad arrangement, an edge-type bonding pad arrangement, a cross-type bonding pad arrangement, and a combination thereof. According to at least one example embodiment, the method may further include forming a bump on the bonding pad of the semiconductor chip. According to at least one example embodiment, the method may further include forming a connection terminal to electrically connect the upper connection pad of the wiring board to the bump.

According to still other example embodiments, a semiconductor package includes a wiring board with a first surface including at least one first connection pad and a second surface including at least one second connection pad, the second surface on a side of the wiring board opposite the first surface, a semiconductor chip with a bonding pad area including at least one bonding pad and an adhesive area outside of the bonding pad area, the semiconductor chip on the first surface, the bonding pad electrically connected to the first connection pad, a first molding layer between the adhesive area and the first surface, and a second molding layer between the bonding pad area and the first surface, a modulus of a material included in the first molding layer less than a modulus of a material included in the second molding layer.

According to further example embodiments, a method of fabricating a semiconductor package includes preparing a semiconductor chip with a bonding pad area including at least one bonding pad and an adhesive area outside of the bonding pad area, preparing a wiring board with a first surface including at least one first connection pad and a second surface including at least one second connection pad, the second surface on a side of the wiring board opposite the first surface, forming a first molding layer corresponding to the adhesive area on the first surface, mounting the semiconductor chip on the first surface such that the bonding pad is electrically connected to the first connection pad, and forming a second molding layer between the bonding pad area and the first surface adjacent to the first molding layer such that a modulus of a first material included in the first molding layer is less than a modulus of a second material included in the second molding layer.

According to still further example embodiments, a semiconductor package, includes a wiring board including at least one connection pad, a semiconductor chip on the wiring board, the semiconductor chip including at least one bond pad, the at least one bond pad connected to the at least one connection pad between the wiring board and the semiconductor chip, a first molding layer including a first molding material between the wiring board and the semiconductor chip, and a second molding layer including a second molding material adjacent to the first molding layer, the second molding layer surrounding the at least one bond pad and the at least one connection pad, a modulus of the second molding layer greater than a modulus of the first molding layer.

BRIEF DESCRIPTION OF THE DRAWINGS

Example embodiments will be more clearly understood from the following brief description taken in conjunction with the accompanying drawings. FIGS. 1A-11 represent non-limiting, example embodiments as described herein.

FIG. 1A is a plan diagram of semiconductor packages according to some example embodiments of the inventive concepts;

FIGS. 5-7 are plan diagrams of semiconductor packages according to still other example embodiments of the inventive concepts;

FIG. 8 is a plan diagram of package modules according to yet further example embodiments of the inventive concept;

FIG. 9 is a block diagram of memory cards according to at least one example embodiment of the inventive concepts;

FIG. 10 is a block diagram of electronic systems according to at least one example embodiment of the inventive concepts; and FIG. 11 is a perspective diagram of electronic devices according to at least one example embodiment of the inventive concepts.

Figure 1A:
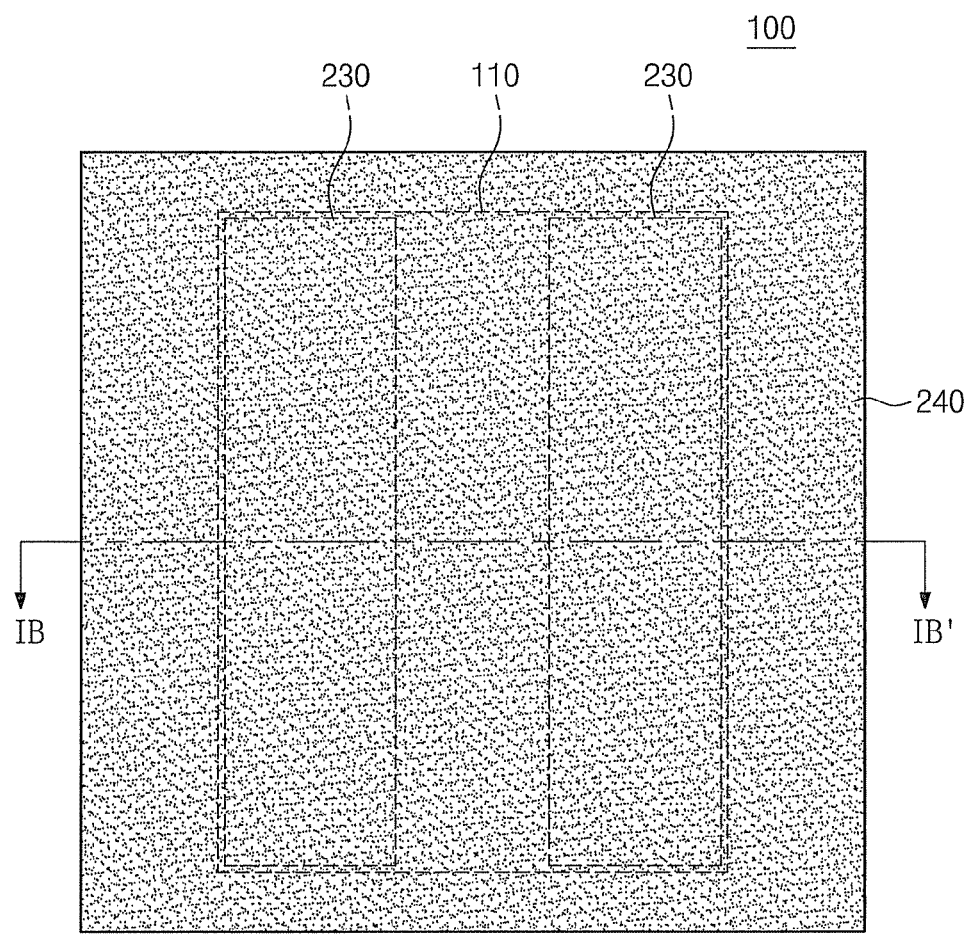

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
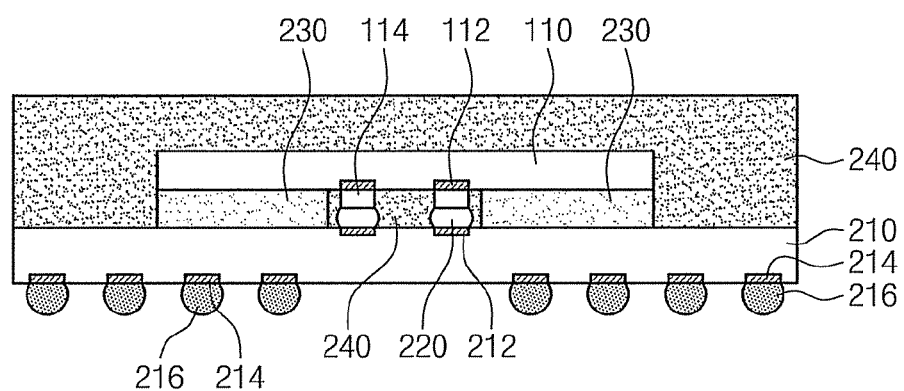
FIG. 1B is a cross-sectional diagram taken along the line IB-IB' of FIG. 1A.

FIG. 1A is a plan diagram of semiconductor packages according to some example embodiments of the inventive concepts. FIG. 1B is a cross-sectional diagram taken along the line IB-IB' of FIG. 1A. Referring to FIGS. 1A and 1B, a semiconductor package 100 may include a semiconductor chip 110, a wiring board 210, and first and second molding layers 230 and 240. The semiconductor chip 110 may include bonding pads 112 on an active surface of the semiconductor chip 110. The bonding pads 112 of the semiconductor chip 110 may be at a center of the active surface according to a center-type bonding pad arrangement. The semiconductor chip 110 may include a bonding pad area in which the bonding pads 112 may be provided and an adhesive area outside of the bonding pad area (e.g., in areas other than the bonding pad area).

Bumps 114 may be on the bonding pads 112 of the semiconductor chip 110. The bumps 114 may be provided, for example, in a case where the bonding pads 112 of the semiconductor chip 110 do not protrude from the active surface of the semiconductor chip 110. The wiring board 210 may include upper connection pads 212 as part of an upper surface of the wiring board 210 and lower connection pads 214 as part of a lower surface of the wiring board 210. The upper connection pads 212 and the lower connection pads 214 may be connected to one another by a circuit pattern (not shown) in the wiring board 210. The semiconductor chip 110 may be mounted on the upper surface of the wring board 210. The wiring board 210 may be, for example, a printed circuit board (PCB). The upper connection pads 212 of the wiring board 210 may be electrically connected to the bonding pads 112 of the semiconductor chip 110. Solder balls 216 may be on the lower connection pads 214 of the wiring board 210 to, for example, electrically connect the lower connection pads 214 to an external circuit.

The bonding pads 112 of the semiconductor chip 110 may be electrically connected to the upper connection pads 212 of the wiring board 210 through connection terminals 220. The semiconductor chip 110 may be, for example, mounted on the upper surface of the wiring board 210 in the form of a flip chip (F/C). The connection terminal 220 may be, for example, a conductive bump, a solder ball, a conductive spacer, a pin grid array (PGA), and/or a combination thereof. In the case where bumps 114 may be on the bonding pads 112 of the semiconductor chip 110, the bonding pads 112 of the semiconductor chip 110 may be electrically connected to the upper connection pads 212 of the wiring board 210 through the bumps 114 and the connection terminals 220.

First molding layers 230 may be between the adhesive area of the semiconductor chip 110 and the upper surface of the wiring board 210. Because the bonding pads 112 of the semiconductor chip 110 may be in a center-type bonding pad arrangement, the first molding layers 230 may be in adhesive areas adjacent to opposite sides of a bonding pad area of the semiconductor chip 110, respectively. The first molding layer 230 may include a material of lower modulus than a material of the second molding layer 240. The first molding layer 230 may be, for example, an adhesive tape and/or a cured screen-printed adhesive liquid material. The second molding layer 240 may be provided between the bonding pad area of the semiconductor chip 110 and the upper surface of the wiring board 210 (e.g., surrounding the wiring board 210) while covering the upper surface of the wiring board 210 and the semiconductor chip 110. The second molding layer 240 may include, for example, an epoxy molding compound (EMC).

Figure 2A:
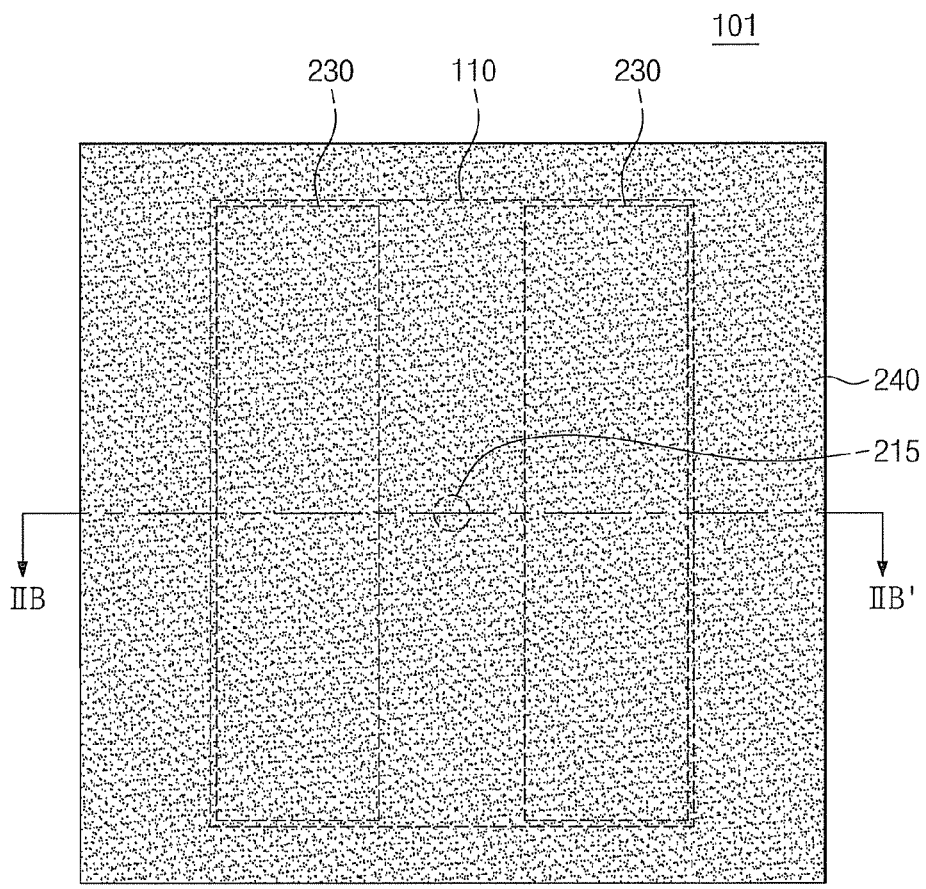
FIG. 2A is a plan diagram of semiconductor packages according to other example embodiments of the inventive concepts.
Figure 2B:
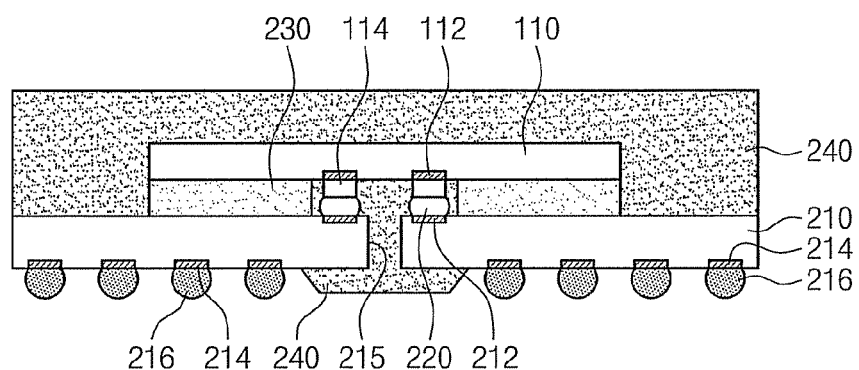
FIG. 2B is a cross-sectional diagram taken along the line IIB-IIB' of FIG. 2A.

FIG. 2A is a plan diagram of semiconductor packages according to other example embodiments of the inventive concepts. FIG. 2B is a cross-sectional diagram taken along the line IIB-IIB' of FIG. 2A. Referring to FIGS. 2A and 2B, a semiconductor package 101 may include a semiconductor chip 110, a wiring board 210, and first and second molding layers 230 and 240. For purposes of explanation, description of elements described with respect to FIGS. 1A and 1B may be omitted in describing example embodiments illustrated in FIGS. 2A and 2B.

Upper connection pads 212 may be part of the upper surface of the wiring board 210 and lower connection pads 214 may be part of the lower surface of the wiring board 210. The upper connection pads 212 and the lower connection pads 214 may be connected to one another by a circuit pattern (not shown) in the wiring board 210. The wiring board 210 may include at least one vent hole 215 that may be formed at a portion corresponding to a bonding pad area of the semiconductor chip 110 to penetrate the wiring board 210. The vent hole 215 may allow a molding material to smoothly flow in a process of forming the second molding layer 240. Because the bonding pads 112 of the semiconductor chip 110 may have a center-type bonding pad arrangement, the vent hole 215 may penetrate a portion in or neighboring the center of the wiring board 210.

The bonding pads 112 of the semiconductor chip 110 may be electrically connected to the upper connection pads 212 of the wiring board 210. The semiconductor chip 110 may be, for example, mounted on the upper surface of the wiring board 210 in the form of flip chip. A second molding layer 240 may fill a space between the bonding pad area of the semiconductor chip 110 and the upper surface of the wiring board 210 and the vent hole 215, and may further cover a portion of the lower surface of the wiring board 210 with width greater than a diameter of the vent hole 215 while covering the upper surface of the wiring board 210 and the semiconductor chip 110. The second molding layer 240 that may cover the portion of the lower surface of the wiring board 210 may extend in one direction on the lower surface of the wiring board 210.

Figure 3A:
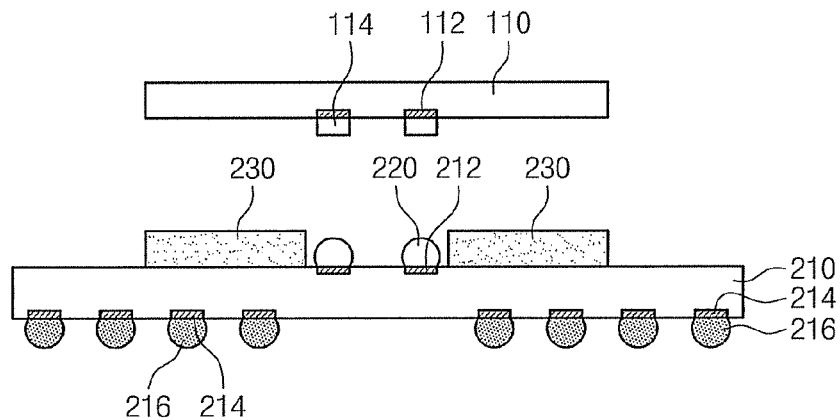
FIGS. 3A-3C are cross-sectional diagrams illustrating methods of fabricating semiconductor packages according to yet other example embodiments of the inventive concepts.
Figure 3B:
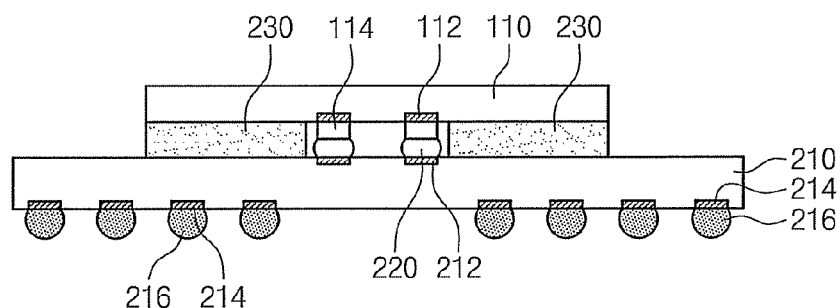
Figure 3C:
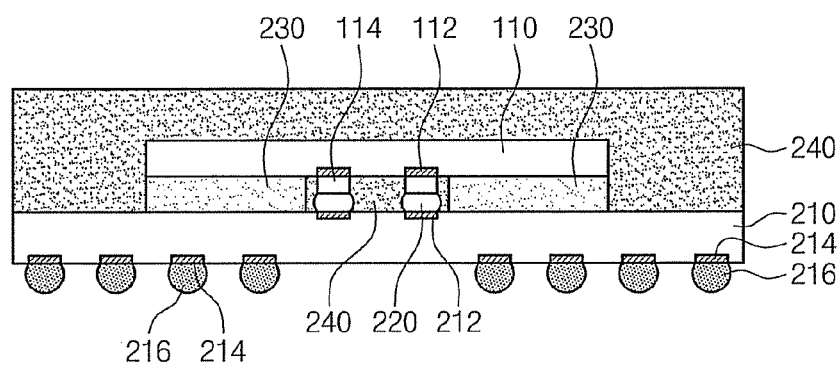

FIGS. 3A-3C are cross-sectional diagrams illustrating methods of fabricating semiconductor packages according to yet other example embodiments of the inventive concepts. Referring to FIG. 3A, a semiconductor chip 110 and a wiring board 210 may be prepared. The semiconductor chip 110 may include bonding pads 112 formed on an active surface of the semiconductor chip 110. The bonding pads 112 of the semiconductor chip 110 may be formed at a center of the active surface in a center-type bonding pad arrangement. The semiconductor chip 110 may include a bonding pad area in which the boding pads 112 are formed and an adhesive area excluding the bonding pad area (e.g., outside of the bonding pad area). Bumps 114 may be formed on the bonding pads 112 of the semiconductor chip 110. The bumps 114 may be formed, for example, in a case where the bonding pads 112 do not protrude from the active surface of the semiconductor chip 110.

The wiring board 210 may include upper connection pads 212 formed as part of an upper surface of the wiring board 210 and lower connection pads 214 formed as part of a lower surface of the wiring board 210. The wiring board 210 may be, for example, a printed circuit board (PCB). The upper connection pads 212 of the wiring board 210 may be electrically connected to the bonding pads 112 of the semiconductor chip 110. Solder balls 216 may be formed at the lower connection pads 214 of the wiring board 210 to electrically connect the lower connection pads 214 to an external circuit.

A first molding layer 230 may be formed on the upper surface of the wiring board 210. The first molding layer 230 may be formed in the adhesive area of the semiconductor chip 110 (e.g., alternatively or concurrently). Because the bonding pads 112 of the semiconductor chip 110 may have the center-type bonding pad arrangement, the first molding layer 230 may be formed in each of the adhesive areas adjacent to opposite sides of the bonding pad area and/or provided on the upper surface of the wiring board 210 corresponding to these adhesive areas.

A modulus of the first molding layer 230 may be less than a modulus of the second molding layer (e.g., 240 in FIG. 3C). The first molding layer 230 may not be formed in the bonding pad area of the semiconductor chip 110 and the upper surface of the wiring board 210 corresponding to the bonding pad area, which may prevent or reduce bonding failure caused by a difference in coefficient of thermal expansion (CTE) between the semiconductor chip 110 and the wiring board 210 according to temperature change in a subsequent process.

The first molding layer 230 may include, for example, an adhesive tape and/or an adhesive liquid material. Because the first molding layer 230 may be high in degree of freedom of its formation method, it may be readily formed irrespective of various arrangements of the boding pads 112 of the semiconductor chip 110. In a case where the first molding layer 230 may include an adhesive liquid material, it may be formed by, for example, screen printing. Connection terminals 220 may be formed on the upper connection pads 212 of the wiring board 210 to electrically connect the upper connection pads 212 to the bonding pads 112 of the semiconductor chip 110. Each of the connection terminals 220 may be, for example, a conductive bump, a solder ball, a conductive spacer, a pin grid array, and/or a combination thereof.

Referring to FIG. 3B, the semiconductor chip 110 may be mounted on the upper surface of the wiring board 210. The bonding pads 112 of the semiconductor chip 110 may be electrically connected to the upper connection pads 212 of the wiring board 210 through the connection terminals 220. The semiconductor chip 110 may be mounted on the upper surface of the wiring board 210, for example, in the form of flip chip. In a case where the bumps 114 are formed on the bonding pads 112 of the semiconductor chip 110, the bonding pads 112 of the semiconductor chip 110 may be electrically connected to the upper connection pads 212 of the wiring board 210 through the bumps 114 and the connection terminals 220.

In a case where the first molding layer 230 may include an adhesive liquid material, curing the first molding layer 230 may be performed (e.g., after mounting the semiconductor chip 110 on the upper surface of the wiring board 210). In a case where the adhesive liquid material may be a thermosetting material, curing the first molding layer 230 may be performed, for example, using a process of reflowing the connection terminals 220 to mount the semiconductor chip 110 on the upper surface of the wiring board 210.

Referring to FIG. 3C, a second molding layer 240 may be foamed. The second molding layer 240 may be formed between the bonding pad area of the semiconductor chip 110 and the upper surface of the wiring board 210 while covering the upper surface of the wiring board 210 and the semiconductor chip 110. The second molding layer 240 may include, for example, an epoxy molding compound (EMC). The forming of the second molding layer 240 may include, for example, inserting the wiring board 210 with the semiconductor chip 110 mounted thereon into a molding apparatus and injecting a molding material into the molding apparatus to be cured. In general, a semiconductor package may be fabricated by mounting a semiconductor chip 110 on each wiring board 210 of a substrate, molding the substrate in a molding apparatus, and cutting the molded substrate.

Figure 4A:
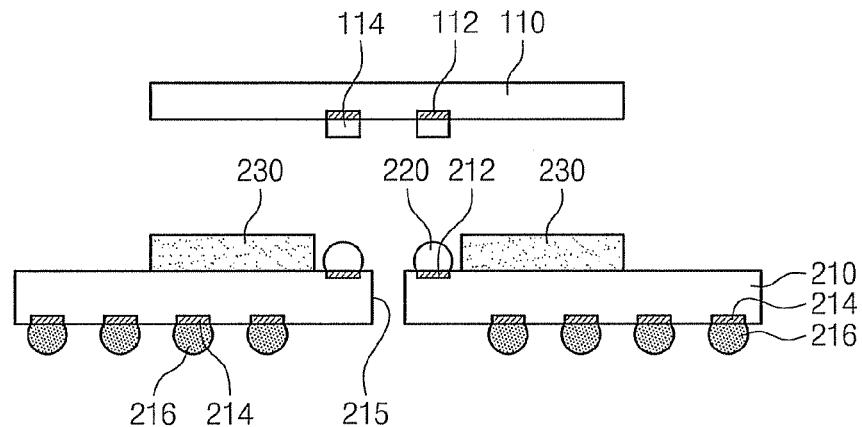
FIGS. 4A-4C are cross-sectional diagrams illustrating methods of fabricating semiconductor packages according to further example embodiments of the inventive concepts.
Figure 4B:
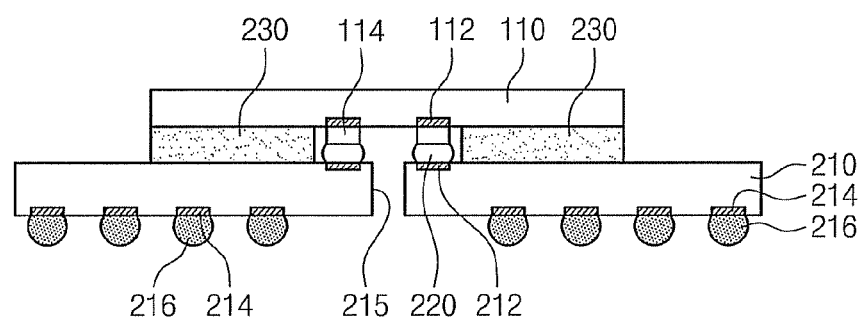
Figure 4C:
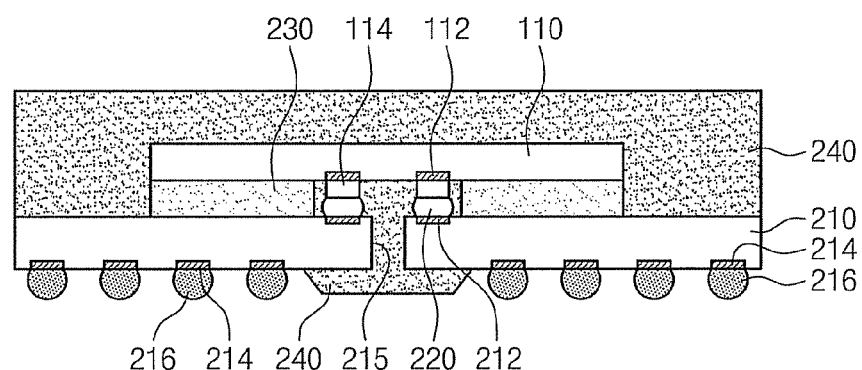

FIGS. 4A-4C are cross-sectional diagrams illustrating methods of fabricating semiconductor packages according to further example embodiments of the inventive concepts. For purposes of explanation, description of elements described with respect to FIGS. 3A-3C may be omitted in describing example embodiments illustrated in FIGS. 4A-4B. Referring to FIG. 4A, a semiconductor chip 110 and a wiring board 210 may be prepared. The wiring board 210 may include at least one vent hole 215 formed at a portion corresponding to a bonding pad area of the semiconductor chip 110 to penetrate the wiring board 210. The vent hole 215 may allow a molding material to smoothly flow in a process for forming a second molding layer 240. Because bonding pads 112 of the semiconductor chip 110 may be in a center-type bonding pad arrangement, the vent hole 215 may formed to penetrate a portion neighboring the center of the wiring board 210.

Referring to FIGS. 4B and 4C, the second molding layer 240 may be, for example, formed after the semiconductor chip 110 is mounted on an upper surface of the wiring board 210. The second molding layer 240 may be formed to fill a space between the bonding pad area of the semiconductor chip 110, the upper surface of the wiring board 210 and the vent hole 215, and may cover a portion of a lower surface of the wiring board 210 with width greater than a diameter of the vent hole 215. The second molding layer 240 may cover the upper surface of the wiring board 210 and the semiconductor chip 110. The second molding layer 240 formed to cover the portion of the lower surface of the wiring board 210 may, for example, extend in one direction on the lower surface of the wiring board 210.

The forming of the second molding layer 240 may include inserting the wiring board 210 with the semiconductor chip 110 mounted thereon into a molding apparatus and injecting a molding material into the molding apparatus to be cured. In general, a semiconductor package may be fabricated by mounting a semiconductor chip 110 on each wiring board 210 of a substrate, molding the substrate in a molding apparatus, and cutting the molded substrate. The flow of molding material injected into the molding apparatus may be improved due to the vent hole 215, and the second molding layer 240 may be formed to extend in one direction on the lower surface of the wiring board 210.

Figure 5:
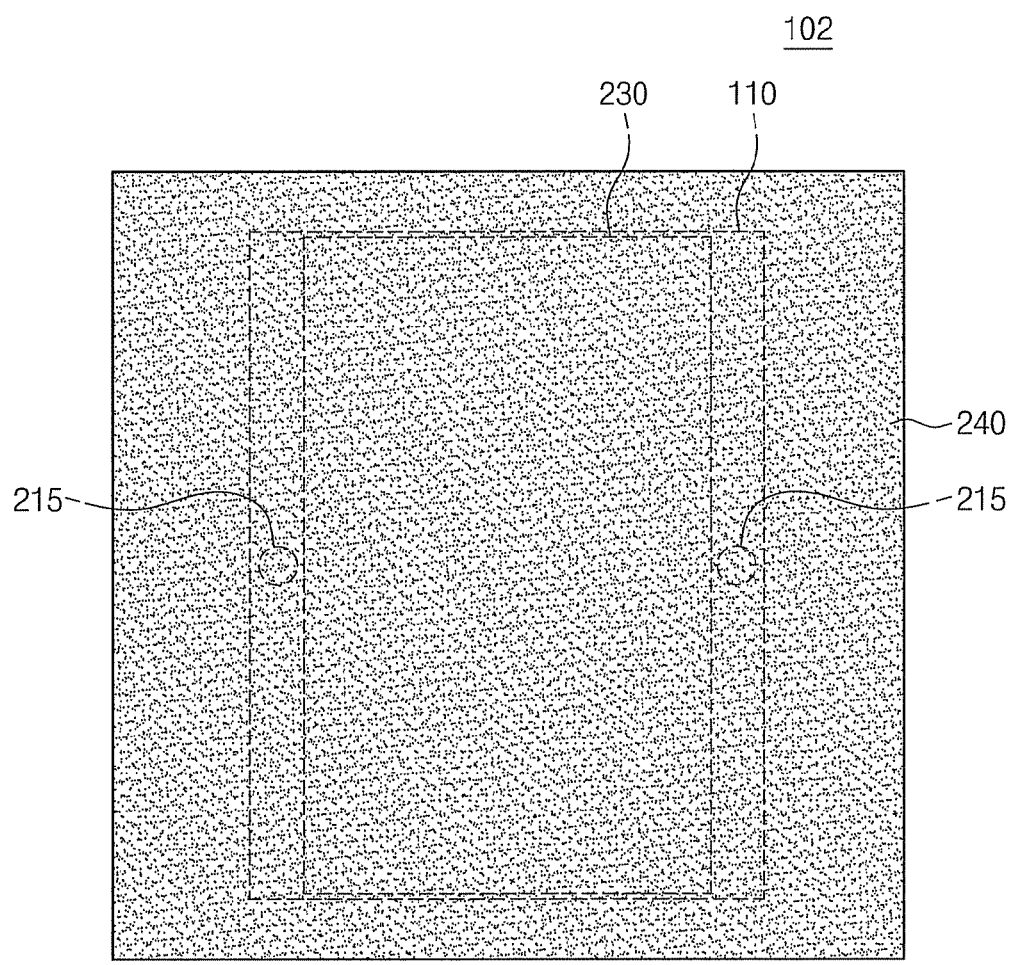
Figure 6:
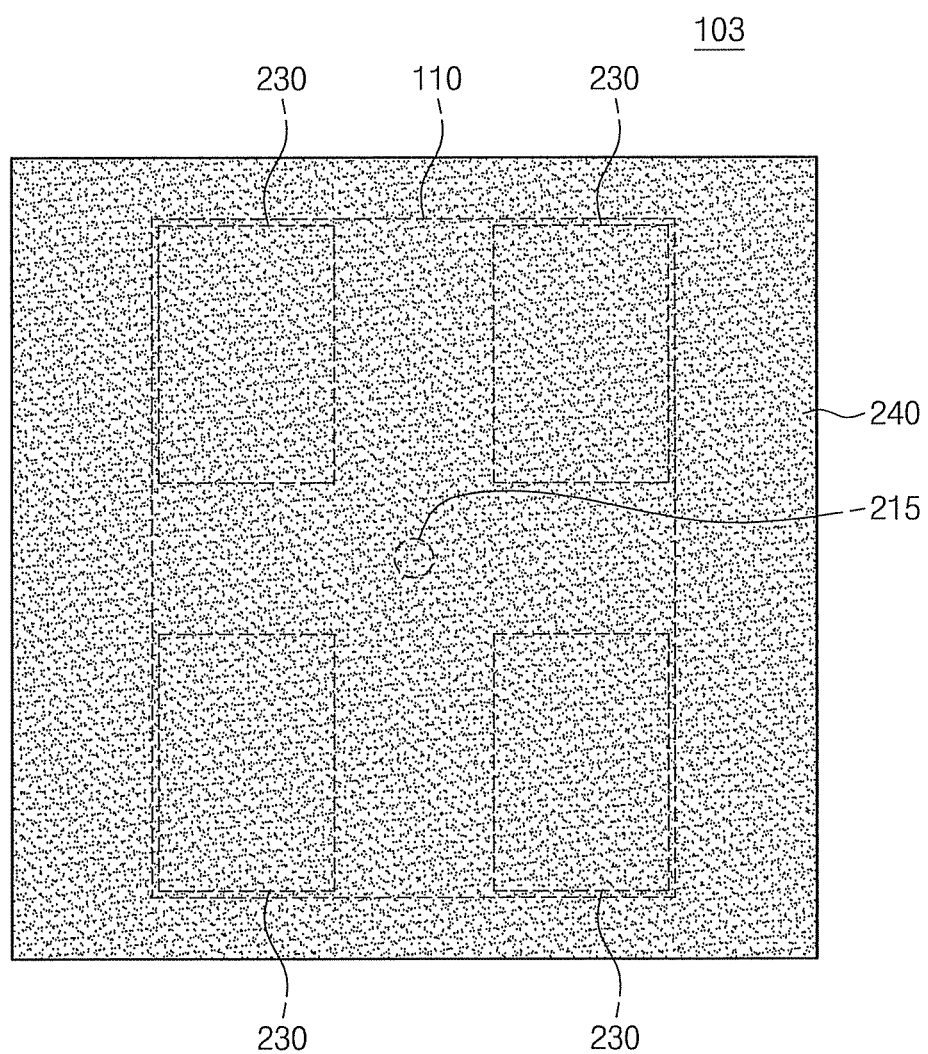
Figure 7:
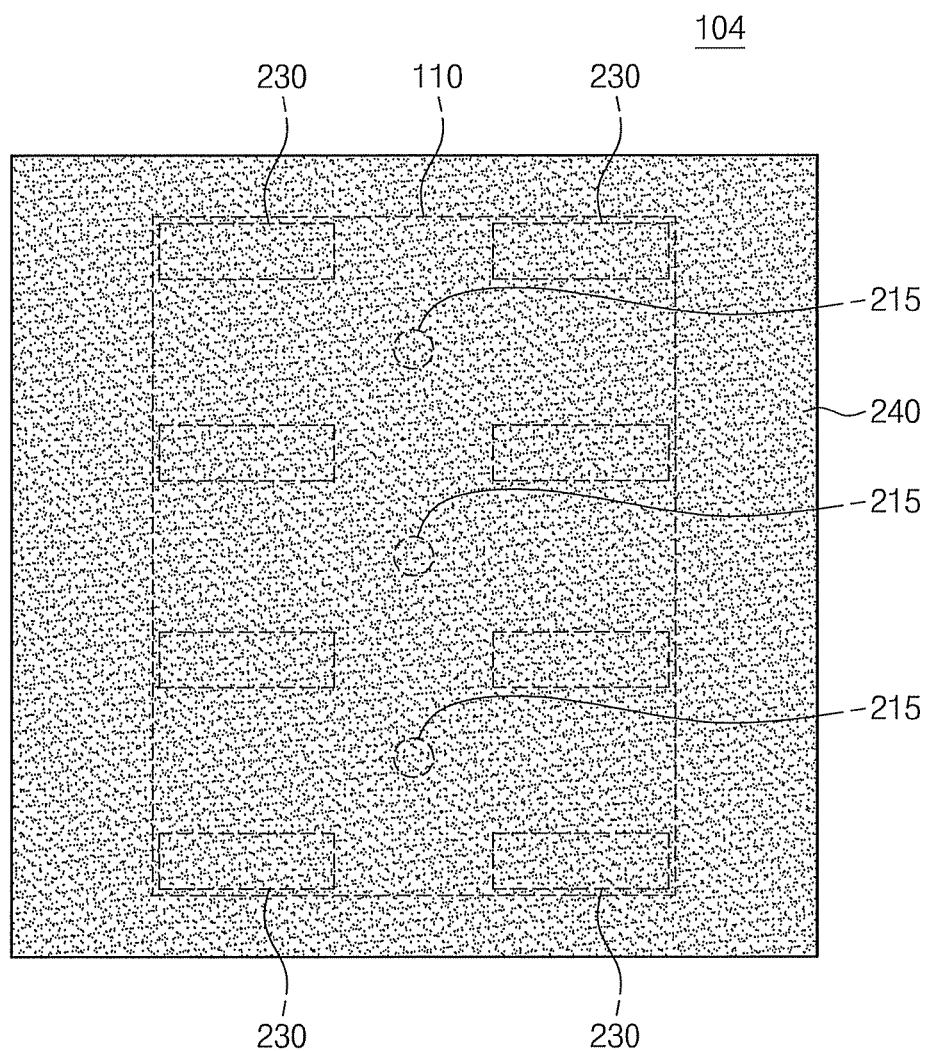

FIGS. 5-7 are plan diagrams of semiconductor packages according to still other example embodiments of the inventive concepts. Description of elements previously described with respect to example embodiments of the inventive concepts, denoted by the same reference numerals, may not be described again. A semiconductor package 102 illustrated in FIG. 5 according to still other example embodiments of the inventive concepts may be different from semiconductor packages according to other example embodiments (e.g., 100 of FIG. 1A and/or 101 of FIG. 2A) in that bonding pads (see 112 in FIG. 1B or 2B) may be in an edge-type bonding pad arrangement. Because bonding pads 112 of a semiconductor chip 110 may be in an edge-type bonding pad arrangement, a first molding layer 230 may be in an adhesive area inside bonding pad areas of the semiconductor chip 110 and at least one vent hole 215 may penetrate a portion of a wiring board (see 210 in FIG. 1B or 2B) corresponding to the edge of the semiconductor chip 110.

A semiconductor package 103 illustrated in FIG. 6 according to yet still other example embodiments of the inventive concepts may be different from semiconductor packages according to other example embodiments (e.g., 100 in FIG. 1A and/or 101 in FIG. 2A) in that bonding pads (see 112 in FIG. 1B or 2B) may be in a cross-type bonding pad arrangement. Because bonding pads 112 of a semiconductor chip 110 may be in a cross-type bonding pad arrangement, a first molding layer 230 may be in adhesive areas at four corners of the semiconductor chip 110 except (e.g., outside of) bonding pad areas of the semiconductor chip 110. At least one vent hole 215 may penetrate a portion of a wiring board (see 210 in FIG. 1B or 2B) corresponding to the bonding pad areas of the semiconductor chip 110.

A semiconductor package 104 illustrated in FIG. 7 according to yet still further example embodiments of the inventive concepts may be different from semiconductor packages according to other example embodiments (e.g., 100 in FIG. 1A and/or 101 in FIG. 2A) in that bonding pads (see 112 in FIG. 1B or 2B) may be in a multicross-type bonding pad arrangement. Because bonding pads 112 of a semiconductor chip 110 may be in a multicross-type bonding pad arrangement, a first molding layer 230 may be in adhesive areas divided by bonding pad areas of the semiconductor chip 110 and at least one vent hole 215 may penetrate a portion of a wiring board (see 210 in FIG. 1B or 2B) corresponding to the bonding pad areas of the semiconductor chip 110.

The arrangement of the bonding pads 112 of the semiconductor chip 110 and the vent hole 215 that penetrating the wiring board (see 210 in FIG. 1B or 2B) may have various types and numbers which may be different from those shown in FIGS. 1A-2B and FIGS. 5-7.

Semiconductor packages according to example embodiments of the inventive concepts may use molding material with different physical characteristics at a portion of a space between a semiconductor chip and a wiring board to improve both reliability of these elements and board-level reliability (BLR). Accordingly, there may be provided semiconductor packages and methods of fabricating the same which use molding material with different physical characteristics at a portion of a space between a semiconductor chip and a wiring board to prevent and/or reduce crack and stress delamination at a boundary surface of a molding layer due to a high residual stress in a precondition process and a reflow process. Semiconductor package reliability may be improved.

Cracks of a connection terminal may be prevented or reduced around the boundary of a semiconductor chip in a thermal cycle (TC). Board-level reliability may be improved. Moreover, a portion of a space between a semiconductor chip and a wiring board may be occupied with molding material with different physical characteristics to readily perform a molding process for covering the semiconductor chip and an upper surface of the wiring board.

Figure 8:
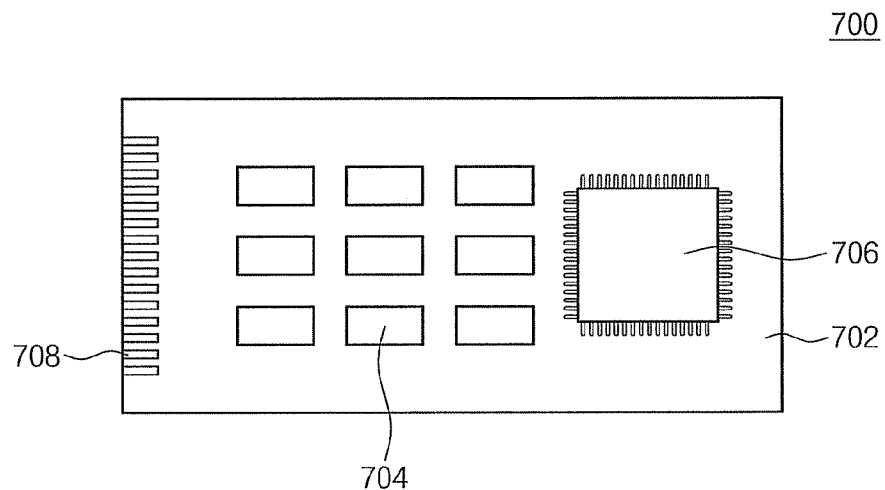

FIG. 8 is a plan diagram of package modules according to yet further example embodiments of the inventive concepts. Referring to FIG. 8, a package module 700 may include a module board 702 with external connection terminals 708, a semiconductor chip 704 mounted on the module board 702, and a quad flatpack (QFP) semiconductor package 706. The QFP semiconductor package 706 may include a semiconductor package according to example embodiments of the inventive concepts described with respect to FIGS. 1A-7. The package module 700 may be connected to an external electronic device through an external connection terminal 708.

Figure 9:
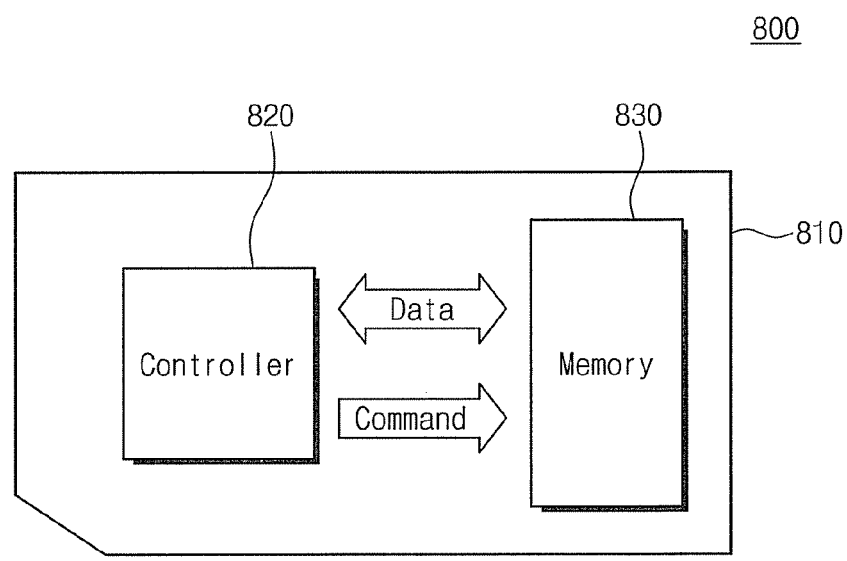

FIG. 9 is a block diagram of memory cards according to at least one example embodiment of the inventive concepts. Referring to FIG. 9, a memory card 800 may include a controller 820 and a memory 830 in a housing 810. The controller 820 and the memory 830 may exchange electronic signals, for example, Data and/or Command signals. The memory card 800 may store data in the memory 830 and/or output data to an external entity from the memory 830. The controller 820 and/or the memory 830 may include a semiconductor package according to example embodiments of the inventive concepts described with respect to FIGS. 1A-7. For example, the controller 820 may include a system-in-package and the memory 830 may include a multi-chip stack package. The controller 820 and/or the memory 830 may be provided with a stack-type package (where, for example, semiconductor packages shown in FIGS. 1A, 2A, and 5-7 are stacked). The memory card 800 may be used as a data storage medium for various portable devices. For example, the memory card 800 may include a multi-media card (MMC) and/or a secure digital (SD) card.

Figure 10:
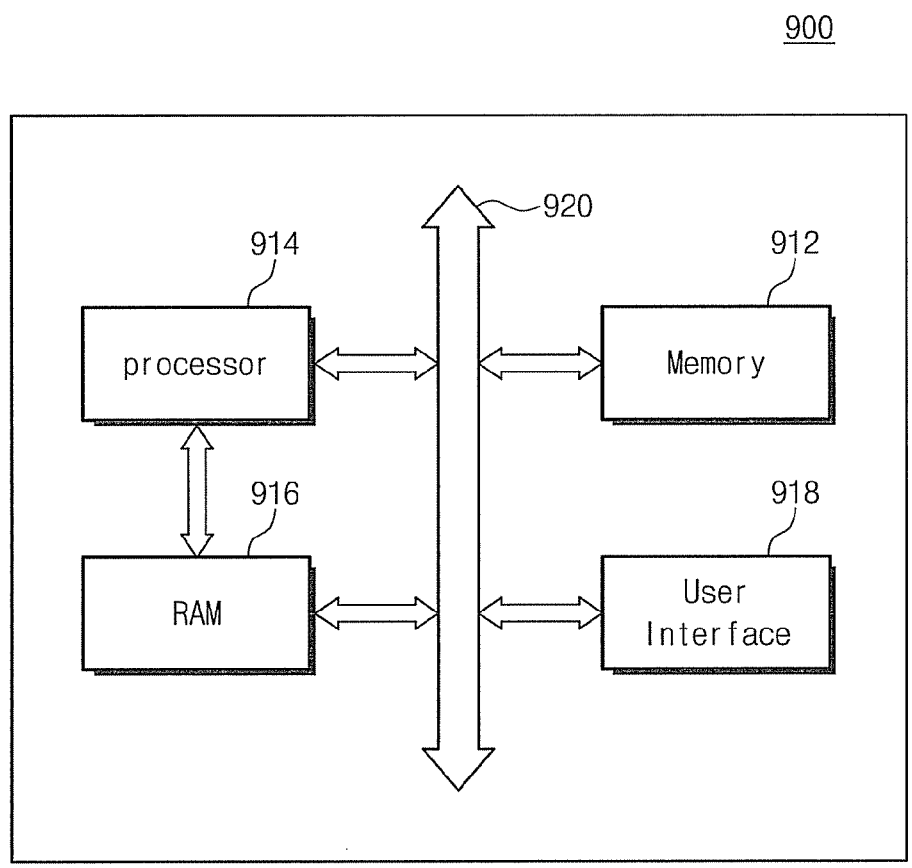

FIG. 10 is a block diagram of electronic systems according to at least one example embodiment of the inventive concepts. Referring to FIG. 10, an electronic system 900 may include at least one semiconductor device and/or semiconductor package according to example embodiments of the inventive concepts described with respect to FIGS. 1A-7. For example, the electronic system 900 may include a memory system 912, a processor 914, a random access memory (RAM) 916, and a user interface 918, which may communicate with one another using a bus 920. The processor 914 may serve to execute a program and control the electronic system 900.

The RAM 916 may be used as a working memory of the processor 914. For example, the processor 914 and the RAM 916 may each include a semiconductor device and/or a semiconductor package according to example embodiments of the inventive concepts. The processor 914 and the RAM 916 may be included in one package. The user interface 918 may be used to input and/or output data to/from the electronic system 900. The memory system 912 may store data processed by the processor 914 and/or externally input data to operate the processor 914. The memory system 912 may include a controller and a memory and may be organized with substantially the same structure as the memory card 800 shown in FIG. 9.

Figure 11:
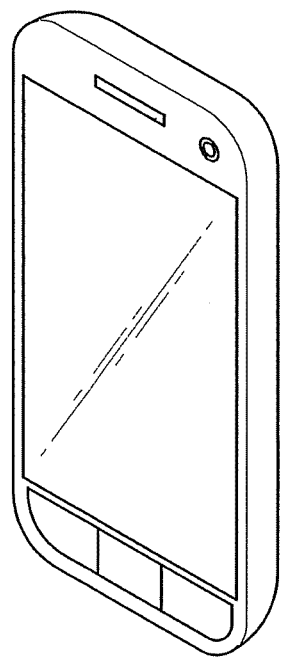

FIG. 11 is a perspective diagram of electronic devices according to at least one example embodiment of the inventive concepts. An electronic system (e.g., 900 in FIG. 10) may be applied to electronic control devices of various electronic apparatuses. FIG. 11 illustrates an example where the electronic system (e.g., 900 in FIG. 10) may be applied to a mobile phone 1000. The electronic system 900 may be applied to, for example, portable laptop computers, MP3 players, navigation systems, solid-state disks (SSDs), automobiles, and/or household appliances.

According to example embodiments, a material of lower modulus than a molding material for molding a semiconductor chip and a wiring board may be provided between the wiring board and the semiconductor chip including an adhesive area, except for in a bonding pad area where a bonding pad is provided. Stresses generated in a semiconductor package and generated when mounting the semiconductor chip on the wiring board may be reduced to provide a semiconductor package with improved reliability. A material with a lower modulus than a molding material for molding a semiconductor chip and a wiring board may be formed earlier than the molding material. Stresses generated in a semiconductor package and generated when mounting the semiconductor chip on the wiring board may be reduced using methods of fabricating semiconductor packages with improved reliability according to example embodiments.

While example embodiments have been particularly shown and described, it will be understood by one of ordinary skill in the art that variations in form and detail may be made therein without departing from the spirit and scope of the claims.

What is claimed is:

1. A semiconductor package, comprising:
a wiring board with a first surface including at least one first connection pad and a second surface including at least one second connection pad, the second surface on a side of the wiring board opposite the first surface;
a semiconductor chip with a bonding pad area including at least one bonding pad and an adhesive area outside of the bonding pad area, the semiconductor chip on the first surface, the bonding pad electrically connected to the first connection pad;
a first molding layer between the adhesive area and the first surface of the wiring board, the first molding layer including an adhesive material; and
a second molding layer between the bonding pad area and the first surface of the wiring board, a modulus of a material included in the first molding layer less than a modulus of a material included in the second molding layer,
wherein ends of the second molding layer contact the first surface of the wiring board to surround the wiring board thereof.

2. The semiconductor package of claim 1, wherein the wiring board includes a vent hole penetrating a portion of the wiring board corresponding to the bonding pad area.

3. The semiconductor package of claim 2, wherein the second molding layer is on a portion of the second surface and covers the vent hole, and a width of the second molding layer on the portion of the second surface is greater than a diameter of the vent hole.

4. The semiconductor package of claim 1, wherein the bonding pad is in one of a center-type bonding pad arrangement, an edge-type bonding pad arrangement, a cross-type bonding pad arrangement, and a combination thereof.

5. The semiconductor package of claim 1, wherein the second molding layer includes an epoxy molding compound.

6. The semiconductor package of claim 1, further comprising:
a bump on the bonding pad.

7. The semiconductor package of claim 1, wherein the adhesive material of the first molding layer is at least one of an adhesive tape and a cured screen printed adhesive liquid material.

8. The semiconductor package of claim 1, wherein the second molding layer is on a top surface of the semiconductor chip.

9. A semiconductor package, comprising:
a wiring board including at least one connection pad;
a semiconductor chip on the wiring board, the semiconductor chip including at least one bond pad, the at least one bond pad connected to the at least one connection pad between the wiring board and the semiconductor chip;
a first molding layer including a first molding material between the wiring board and the semiconductor chip, the first molding layer including an adhesive material; and
a second molding layer including a second molding material adjacent to the first molding layer, the second molding layer surrounding the at least one bond pad and the at least one connection pad, a modulus of the second molding layer greater than a modulus of the first molding layer,
wherein ends of the second molding layer contact a first side of the wiring board to surround the wiring board thereof.

10. The semiconductor package of claim 9, wherein the second molding layer includes:
   a first portion on the first side of the wiring board,
   a second portion on a second side of the wiring board, and
   a third portion connecting the first and second portions through the wiring board.

11. The semiconductor package of claim 10, wherein the second molding layer includes a fourth portion connecting the first and second portions through the wiring board.

12. The semiconductor package of claim 10, wherein the second molding layer is on at least two opposite sides of the first molding layer between the semiconductor chip and the wiring board.

13. The semiconductor package of claim 10, further comprising:
   a third molding layer including the first molding material between the wiring board and the semiconductor chip, the second molding layer between the first and third molding layers.

14. The semiconductor package of claim 9, wherein the adhesive material of the first molding layer is at least one of an adhesive tape and a cured screen printed adhesive liquid material.

15. The semiconductor package of claim 9, wherein the second molding layer is on a top surface of the semiconductor chip.

* * * * *